United States Patent [19]
Gaudrel et al.

[11] Patent Number: 6,147,867
[45] Date of Patent: Nov. 14, 2000

[54] ELECTRONIC SPEED VARIATOR

[75] Inventors: Lionel Gaudrel, Mantes la Jolie; François Gaudet, Magnanville; Hervé Guigueno, Saint Maur des Fosses, all of France

[73] Assignee: Schneider Electric SA, Boulogne Billancourt, France

[21] Appl. No.: 09/195,220

[22] Filed: Nov. 18, 1998

[30] Foreign Application Priority Data

Nov. 21, 1997 [FR] France ................................. 97 14884

[51] Int. Cl.⁷ ........................................................ H05K 7/20
[52] U.S. Cl. ............................ 361/707; 361/715; 361/690
[58] Field of Search ...................................... 361/600, 679, 361/688, 690, 704, 707, 709–711, 715

[56] References Cited

U.S. PATENT DOCUMENTS

| | | | |
|---|---|---|---|
| 5,132,874 | 7/1992 | Chandler et al. | 361/690 |
| 5,497,289 | 3/1996 | Sugishima et al. | 361/709 |

*Primary Examiner*—Gregory Thompson
*Attorney, Agent, or Firm*—Oblon, Spivak, McClelland, Maier & Neustadt, P.C.

[57] ABSTRACT

An electronic speed variator having a heat sink forming the bottom of a variator housing. Heat emitting components such as capacitors are attached to the heat sink. The heat sink has a flat sole plate and is coupled to a ribbed radiator through the wall of a cabinet.

3 Claims, 2 Drawing Sheets

ELECTRONIC SPEED VARIATOR

This invention relates to an electronic speed variator comprising a heat sink forming the bottom of the housing and used to fix heat emitting components such as capacitors on the inside.

Speed variators used to control the speed of motors contain capacitors and power modules which generate heat that is removed through the back of the housing through a heat radiator.

Document EP 660 652 proposed to make a variator consisting of a back part containing the cooling equipment and a front part containing the electronics so that parts generating heat can be taken outside a sealed enclosure. In order to install this variator on a container, a rectangular opening has to be cut out of the wall of this container, the two parts installed on the two sides of the wall being connected to each other by screws.

The purpose of this invention is to provide a speed variator equipped with a heat sink forming the bottom of the housing and a second ribbed radiator that may be attached to the heat sink so that it is removable and separable from the variator. The ribbed radiator may be installed outside the container and the variator may be installed inside the container, without the need to disassemble the variator and without the need to cut a hole in the container wall. This ribbed radiator may also form the bottom of a motor output assembly housing and be used for the assembly of different motor output components.

The electronic speed variator according to the invention is characterized by the fact that the heat sink consists of a flat sole plate and is coupled through its plane rear surface to a ribbed radiator that is fixed so that it can be removed.

According to one characteristic, the variator comprises a thin heat conducting flexible film between the sole plate and the radiator.

According to one characteristic, the plane sole plate is attached to the inside of the wall of the electrical container, and the ribbed radiator is attached to the outside of the said wall.

According to one characteristic, the ribbed radiator is larger than the sole plate and forms the bottom of a motor output container on which other electrical equipment is fixed in addition to the variator.

The invention will now be described in more detail with reference to embodiments given as examples and shown in the attached drawings on which:

Figure 1:
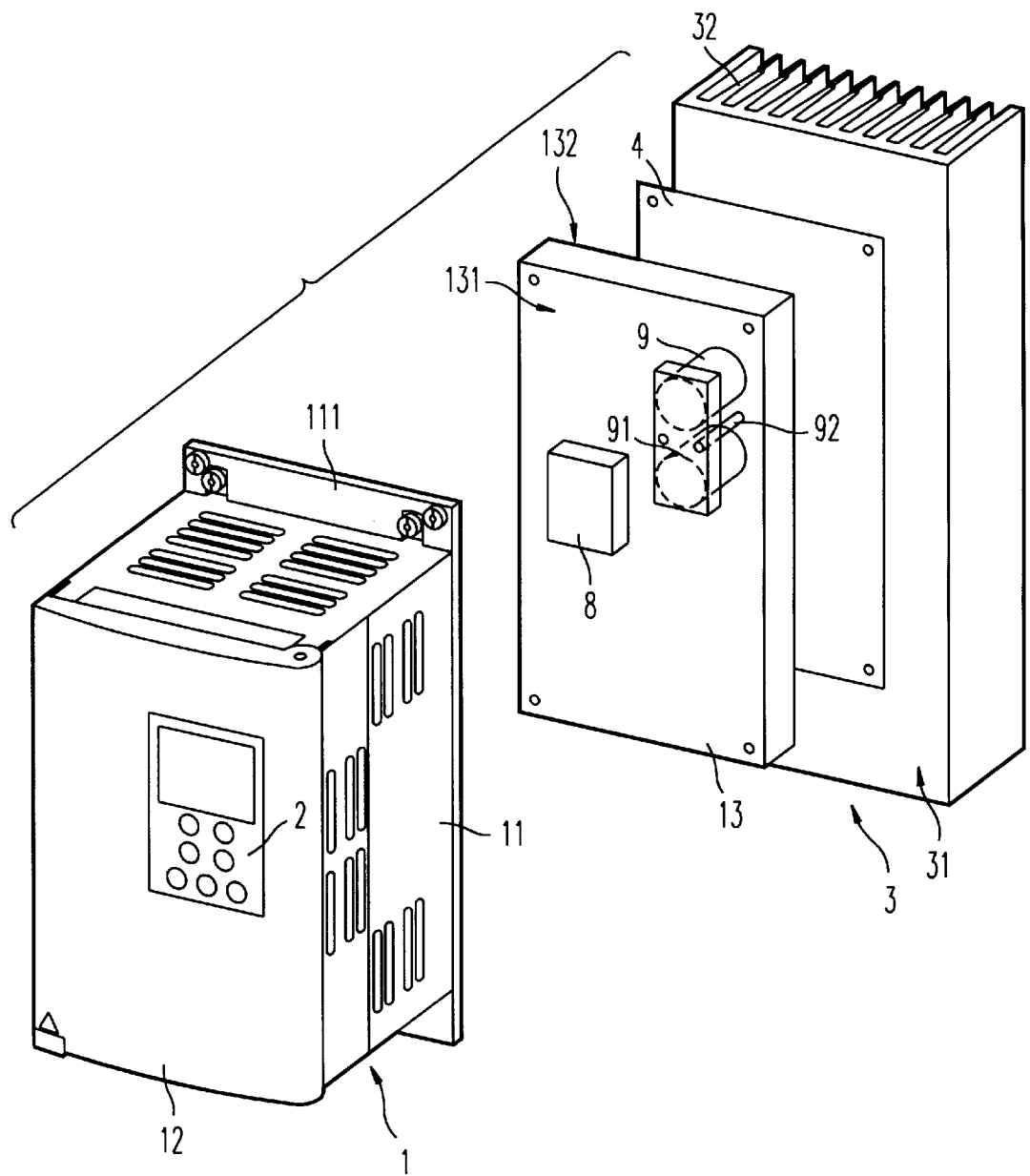
FIG. 1 is an exploded perspective view of the variator with a heat sink and a radiator according to the invention.

The electronic speed variator shown on the drawings is enclosed in a housing 1 consisting of a housing frame 11 closed at the front by cover 12 and at the back by a flat heat sink 13.

Cover 12 is installed to pivot on the frame of housing 11 by means of side hinges and is locked onto the housing body by means of a lock. The frame of the housing 1 is fixed onto a support using attachment tabs 111 fixed at the back. Cables pass through the lower part of the housing. The sides of the housing frame are fitted with aeration louvers.

Housing 1 contains a diode rectifier connected to the network and powering a converter connected to the motor through filter capacitors 9. The converter is equipped with power modules 8 fitted with static electronic power switches associated with recovery diodes.

The power modules 8 and capacitors 9 are mounted on the internal first surface 131 of a plane sole plate 13 in the shape of a thick plate and advantageously made of aluminum or aluminum alloy in order to conduct heat. The flat external second surface 132 of the sole plate 13 is used to dissipate heat. Capacitors 9 are pressed in contact with the sole plate by a flange 91 fixed to the sole plate 13 by stands 92.

The housing contains an electronic control assembly that controls power module static switches.

Housing 1 contains an insulating plastic protection cap that covers and protects the electronics contained in the housing when the cover 12 is opened. This protective cover keeps a large part of the housing body closed. It is visible as soon as the cover 12 is opened and protects the operator from electric shocks. It supports a dialogue console 2 that is flush with a cutout in the cover when the cover is closed.

The flat heat sink 13 that forms the bottom of the housing works in cooperation with a ribbed radiator 3 that can be attached to the heat sink but is removable and separable from the variator. This ribbed radiator 3 has a plane surface 31 on one side that comes into contact with the back surface 132 of the flat heat sink 13, and cooling ribs 32 on the other side.

Contact between the flat heat sink 13 and the ribbed radiator 3 is made through a thin flexible thermal sheet 4 that conducts heat between the sole plate 13 and the radiator 32 while providing electrical insulation. For example, this thermal sheet may consist of a metal sheet coated on both sides by a layer of electrical insulation, or by a carbon sheet coated on both sides by an elastomer.

Housing 11 comprises a plastic shield on its upper side above the ventilation louvers, preventing ingress of metal particles or conducting dust from dropping vertically and providing protection for persons and enabling heat dissipation from elements generating heat inside the variator. This screen includes an aeration duct above the ventilation louvers to enable air circulation while preventing the passage of particles.

Figure 2:
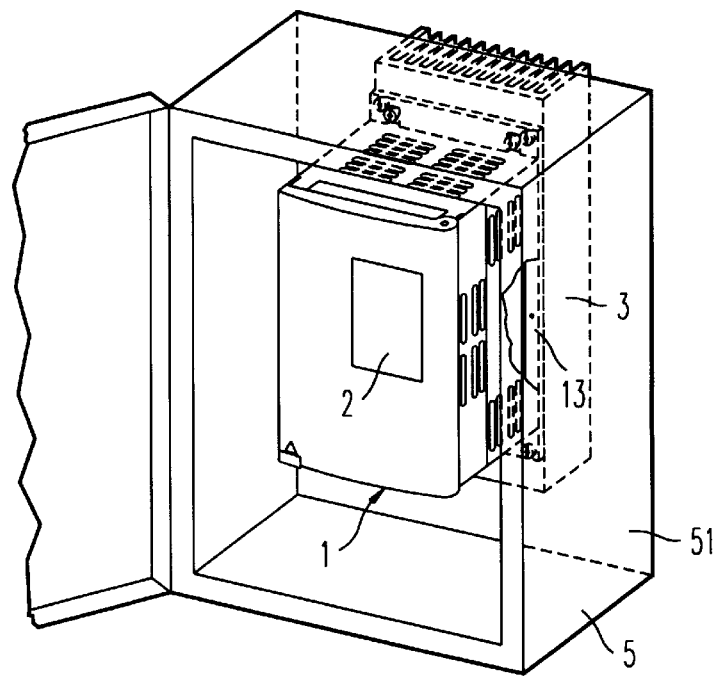
FIG. 2 is a view showing the variator installed in an electrical container.

In the assembly illustrated in FIG. 2, the variator is installed inside an electrical container 5 so that the sole plate 13 is in contact with the internal surface of the wall 51 of this container, two intermediate thermal sheets 4 being inserted on each side of the wall. The ribbed radiator 3 is installed on the outside of the container wall 51 and facing the flat sole plate 13. Heat is conducted through wall 51, which is metallic. The variator 1 is installed inside the container without the need for any disassembly and without the need to cut the container wall. The only operation that is necessary is to drill four holes in the container wall for the screws that connect the ribbed radiator 3 to the variator.

Figure 3:
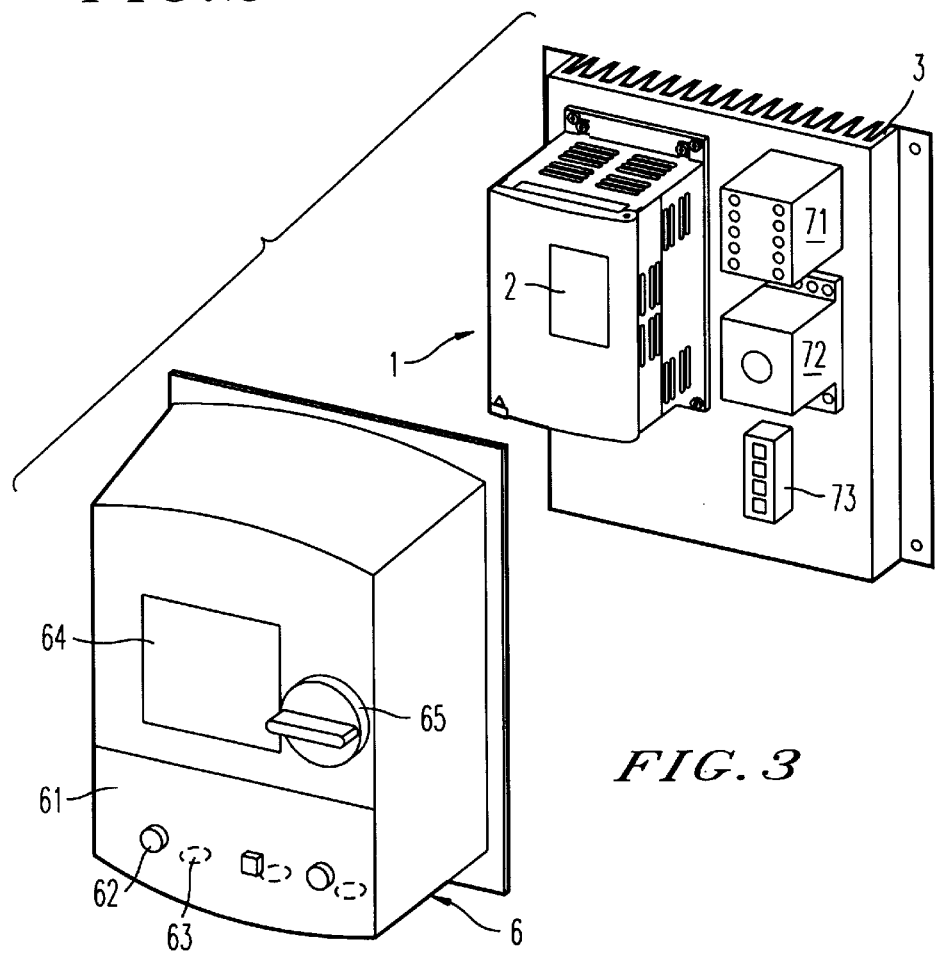
FIG. 3 is an exploded view showing the variator in an assembly forming a motor output.

In the assembly shown on FIG. 3, the ribbed radiator 3 is larger than the flat sole plate 13 and forms the bottom of a housing 6 containing a motor output. This ribbed radiator 3 is used for the assembly of the different components of the motor output, particularly the speed variator 1 but also a conductor 71, a circuit breaker-motor 72 and a connector 73. The housing 6 is fitted with a mobile cover 64 used to reach the dialog console 2 and a removable cover 61 supporting dialog units 62 and passages 63 for cables. A control button 65 controls the circuit breaker-motor.

Obviously, it would be possible to imagine variations and detailed improvements or even to consider the use of equivalent means, without going outside the framework of the invention.

What is claimed is:

1. An electronic speed variator assembly comprising:

a variator housing;

a container configured to contain the variator housing therein and including a wall having opposite inside and outside;

a heat sink which forms a bottom of the variator housing, said heat sink including a flat sole plate which has opposite first and second surfaces, the second surface of the flat sole plate being attached to the inside of the wall of the container;

heat emitting components attached to the first surface of the flat sole plate; and a ribbed radiator attached to the outside of the wall of the container to be thermally connected to the heat sink via the wall of the container.

2. An electronic speed variator assembly according to claim 1, further comprising a thin flexible thermal sheet fitted between said heat sink and said ribbed radiator to conduct heat.

3. An electronic speed variator assembly according to claim 1, further comprising two intermediate thermal sheets with one between the second surface of the flat sole plate and the inside of the wall of the container and a second between the ribbed radiator and the outside of the wall of the container.

* * * * *